United States Patent [19]

Hashimoto et al.

[11] Patent Number: 5,332,934
[45] Date of Patent: Jul. 26, 1994

[54] SMALL TO FULL SWING CONVERSION CIRCUIT

[76] Inventors: Masashi Hashimoto, Onogaw 14-32, Tsukuba-shi, Ibaraki-ken, Japan; Deog-Kyoon Jeong, 244-2 Gyosu Apt. Ga-201, Bongchung-Dong, Gwanak-ku, Seoul, Rep. of Korea

[21] Appl. No.: 430
[22] Filed: Jan. 4, 1993
[51] Int. Cl.$^5$ .......................................... H03K 17/10
[52] U.S. Cl. ..................................... 307/475; 307/451
[58] Field of Search ................ 307/443, 451, 475, 264

[56] References Cited

U.S. PATENT DOCUMENTS

| | | | |
|---|---|---|---|
| 4,450,371 | 5/1984 | Bismarck | 307/475 |
| 4,578,600 | 3/1986 | Magee | 307/451 |
| 4,791,321 | 12/1988 | Tanaka et al. | 307/475 X |
| 4,818,901 | 4/1989 | Young et al. | 307/443 X |
| 5,198,699 | 3/1993 | Hashimoto et al. | 307/451 X |

*Primary Examiner*—David R. Hudspeth
*Attorney, Agent, or Firm*—John D. Crane; Richard L. Donaldson; William E. Hiller

[57] ABSTRACT

A signal receiver (20) for converting a small swing signal into a full swing signal. The signal receiver (20) includes an input stage (22), having a first power input terminal (32), a second power input terminal (34), a small swing signal input terminal (30), and an intermediate signal output terminal (36), wherein the input stage (22) generates an intermediate signal on the intermediate signal output terminal (36). Signal receiver (20) further includes an output stage (28), having an intermediate signal input terminal (50) for receiving the intermediate signal, and an output terminal (56), wherein the output stage (28) generates the full swing signal on the output terminal (56). A first feedback stage (24) is provided, which includes a first power supply terminal (38), a first feedback terminal (42), and a first control signal terminal (40) coupled to the first power input terminal (32), wherein the first feedback stage (24) generates a first control signal to the first power input terminal (32). A second feedback stage (26) is provided, which includes a second power supply terminal (44), a second feedback terminal (48), and a second control signal terminal (46) coupled to the second power input terminal (34), wherein the second feedback stage (26) generates a second control signal to the second power input terminal (34).

16 Claims, 2 Drawing Sheets

SMALL TO FULL SWING CONVERSION CIRCUIT

TECHNICAL FIELD OF THE INVENTION

This invention relates in general to the field of electronic circuits and more particularly to a driver for converting a large swing signal into a small swing signal for transmission over long connection lines and a receiver for reconverting the signal after transmission.

BACKGROUND OF THE INVENTION

In integrated circuits, particularly CMOS integrated circuits, there is a need to have long signal lines to route a signal from one portion of a chip to another portion of the same chip. In order to conserve power on signal transitions, it is desirable to either reduce the capacitance on the line and/or the signal amplitude on the line. With CMOS integrated circuits, the gate capacitance is large, and cannot easily be reduced. Therefore, it is desirable to drive these long routing lines with a reduced amplitude swing signal. However, this requires special driver circuits.

After transmission, these small swing signals must be converted back into full swing signals. Existing small swing to full swing conversion circuits, generally called receivers, generally use a substantial amount of power during static states, that is, when there is no small swing signal transition at the receiver input. Such substantial power dissipation can approach thirty to forty percent of the integrated circuit's total power dissipation. For integrated circuits designed for use with battery power supplies, the substantial power drain from the receiver circuit in stand-by mode is very undesirable. Therefore, a need has arisen for a signal receiver which uses little or no power in the stand-by mode.

SUMMARY OF THE INVENTION

One aspect of the present invention is a signal receiver that eliminates or substantially reduces disadvantages and problems associated with prior signal receivers.

The signal receiver converts a small swing signal into a full swing signal. It has an input stage for generating an intermediate signal on an intermediate output terminal. A first feedback stage delivers a first control signal to the input stage. A second feedback stage delivers a second control signal to the input stage. An output stage receives the intermediate signal and generates the full swing signal, which is fed to each of the first and second feedback stages.

Another aspect of the present invention is a signal driver for converting a full swing signal into a small swing signal. The signal driver comprises a first and second transistor, with a common input terminal and a common output terminal. The first transistor generates a reduced high level on the output terminal when the full swing signal is at a high level. This reduced high level corresponds to a high level of the small swing signal. The second transistor generates an increased low level when the full swing signal is at a low level. This increased low level corresponds to a low level of the small swing signal.

A first technical advantage of the present invention is that the signal receiver uses little or no power during static operation. A second technical advantage is that the input capacitance of the signal receiver is not increased beyond that of the prior art. A third technical advantage is that a single power supply can be used to power the input, output and feedback stages. A fourth technical advantage of the invention is that when the signal receiver is used in a battery-driven integrated circuit, there is less static power drain on the battery. Thus, the battery life is prolonged.

BRIEF DESCRIPTION OF THE DRAWINGS

For a more complete understanding of the present invention, and the advantages thereof, reference is now made to the following description, taken in conjunction with the accompanying drawings in which like reference numbers indicate like features and wherein.

DETAILED DESCRIPTION OF THE INVENTION

The preferred embodiments of the invention are illustrated in FIGS. 1–4 of the drawings, like numerals being used to refer to like and corresponding parts of the various drawings.

Figure 1:
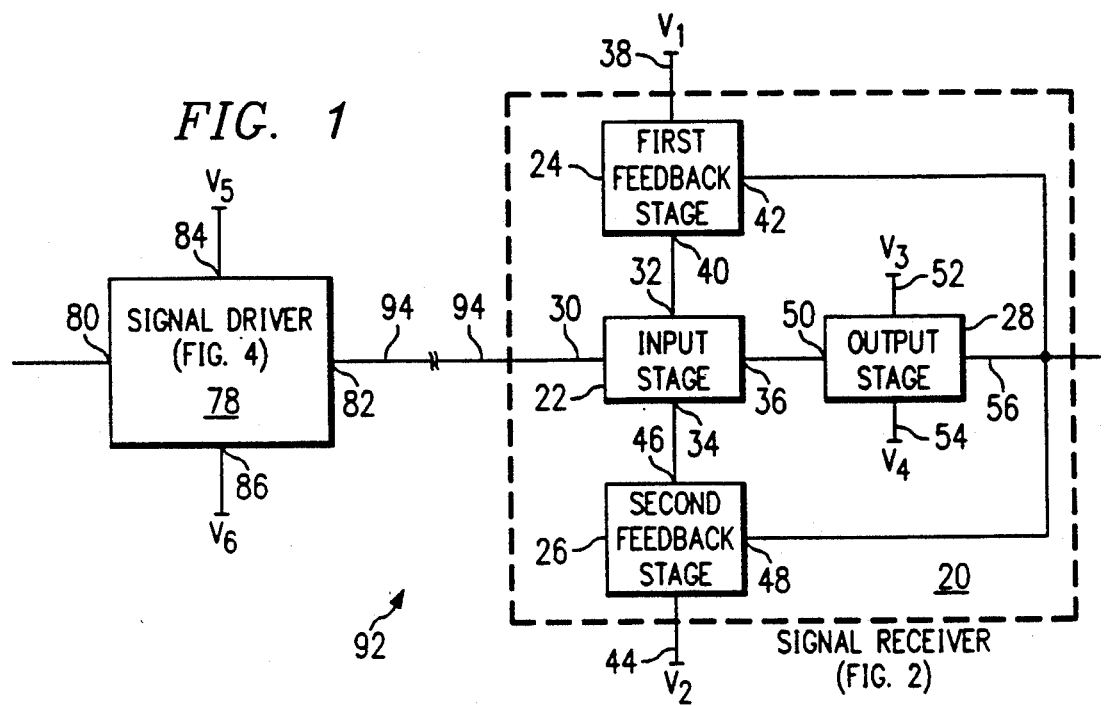
FIG. 1 is a full swing/small swing conversion circuit.

FIG. 1 is a full swing/small swing conversion circuit, or signal driver/receiver circuit 92, whose combined operation will be discussed in detail outwardly.

Included in FIG. 1 is a signal receiver 20 providing an input stage 22, a first feedback stage 24, a second feedback stage 26, and an output stage 28.

Input stage 22 includes a small swing signal input terminal 30, a first power input terminal 32, a second power input terminal 34, and an intermediate signal output terminal 36.

First feedback stage 24 provides a power supply terminal 38 coupled to a voltage $V_1$, a first control signal terminal 40 coupled to first power input terminal 32, and a first feedback terminal 42.

Second feedback stage 26 includes a second power supply terminal 44 coupled to a voltage $V_2$, a second control signal terminal 46 coupled to second power input terminal 34, and a second feedback terminal 48.

Output stage 28 provides an intermediate signal input terminal 50 coupled to intermediate signal output terminal 36, a third power supply terminal 52 coupled to a voltage $V_3$, a fourth power supply terminal 54 coupled to a voltage $V_4$, and an output terminal 56 coupled to both first feedback terminal 42 and second feedback terminal 48.

Figure 2:
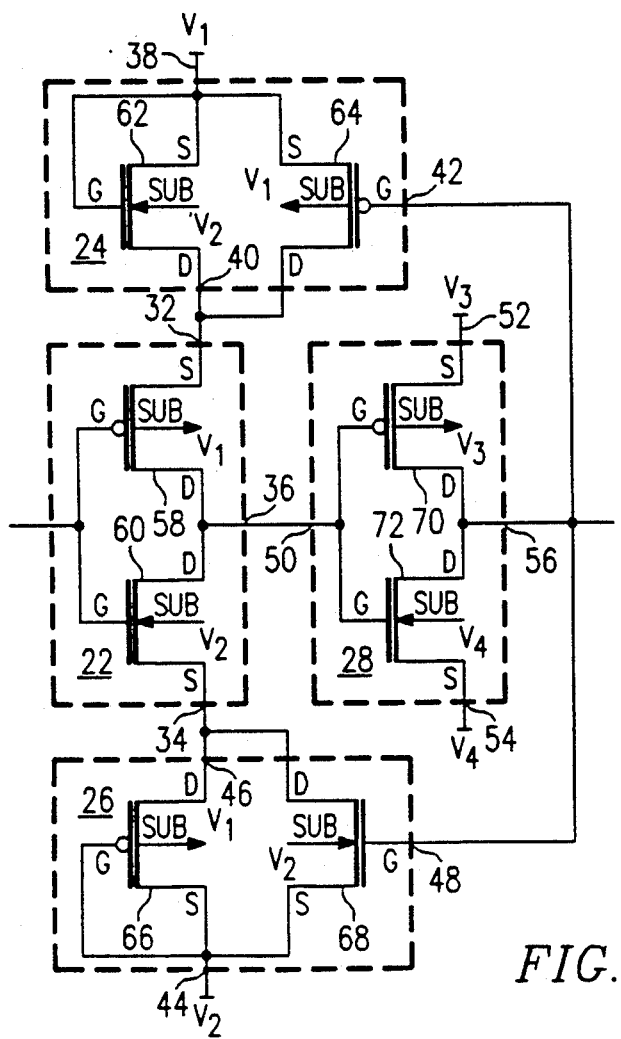
FIG. 2 is a circuit diagram of the signal receiver of FIG. 1.

FIG. 2 is a circuit diagram of the signal receiver 20. Input stage 22 includes a P-channel MOS transistor 58 and an N-channel MOS transistor 60. The gates (G) of both transistors 58 and 60 are coupled to the small swing signal input terminal 30, and the drains (D) of both transistors 58 and 60 are coupled to intermediate signal output terminal 36. The source (S) of transistor 58 is coupled to first power input terminal 32, while the source of transistor 60 is coupled to second power input terminal 34.

First feedback stage 24 includes an N-channel transistor 62 and a P-channel transistor 64. N-channel transistor 62 has both its gate and source coupled to first power supply terminal 38, and has its drain coupled to first control signal terminal 40. P-channel transistor 64 has its drain coupled to first control signal terminal 40, its source coupled to first power supply terminal 38, and its gate coupled to first feedback terminal 42.

Second feedback stage 26 includes a P-channel transistor 66 and an N-channel transistor 68. Transistor 66 has its drain coupled to second control signal terminal 46, and both its source and gate coupled to second power supply terminal 44. N-channel transistor 68 has its drain coupled to second control signal terminal 46, its source coupled to second power supply terminal 44, and its gate coupled to second feedback terminal 48.

The substrates (SUB) of transistors 58, 64, and 66 are coupled to first power supply terminal 38. For clarity of FIG. 2, these substrates are shown coupled to voltage $V_1$, which is the voltage provided to first power supply terminal 38. Likewise, the substrates of transistors 60, 62, and 68 are coupled to second power supply terminal 44, but for clarity are shown coupled to voltage $V_2$.

Output stage 28 includes a P-channel transistor 70 and an N-channel transistor 72. Transistor 70 has its source coupled to third power supply terminal 52, its drain coupled to output terminal 56, and its gate coupled to intermediate signal input terminal 50. Transistor 72 has its drain coupled to output terminal 56, its source coupled to fourth power supply terminal 54, and its gate coupled to intermediate signal input terminal 50. The substrate of transistor 70 is coupled to third power supply terminal 52, but, for clarity of FIG. 2, is shown coupled to voltage $V_3$, the voltage supplied to third power supply terminal 52. Similarly, the substrate of transistor 72 is coupled to fourth power supply terminal 54, but is shown coupled to voltage $V_4$.

Voltages $V_1$–$V_4$ may all be different in value from one another. However, for the embodiments described herein, $V_1=V_3=V_{cc}=5.0$ volts, and $V_2=V_4=V_g=0.0$ volts. Also, for the embodiments described herein, the amplitude of a small swing signal, input on small swing signal input terminal 30, alternates between a high level or first state equal to 3.9 volts and a low level or second state equal to 1.1 volts. Finally, for the embodiments described herein, the threshold or turn-on voltage of all transistors is 1.1 volts. Other embodiments may employ different voltage levels for the small swing signal and the turn-on voltage without departing from the spirit and scope of the invention.

In operation, the small swing signal is applied to the small swing signal input terminal 30 of input stage 22. When the small swing signal makes a transition to a low level, or 1.1 volts, transistor 60 shuts off. This occurs because the voltage at second power input terminal 34 is the turn-on or threshold voltage of transistor 66, or 1.1 volts. This results from transistor 66 being in a diode type configuration, that is, with its gate and source tied to the same voltage potential. With the voltage at the source of transistor 60 equalling that at its gate, the gate-source voltage is zero volts, which is less than the turn-on voltage of 1.1 volts. Thus, transistor 60 is completely shut off, that is it conducts no current between its drain and its source. The voltage at first power input terminal 32 is at the voltage level $V_{cc}$ minus the turn-on voltage of transistor 62. Again, this results from transistor 62 being in a diode type configuration. Therefore, the voltage at first power input terminal 32 is 3.9 volts. Thus, the voltage between the source and the gate of transistor 58 is 2.8 volts, which is greater than the 1.1 volts turn-on voltage of transistor 58. This 2.8 volt differential results in transistor 58 turning "full" on. The voltage at intermediate signal output terminal 36 is now the same as the voltage at first power input terminal 32, which is 3.9 volts. Thus, transistor 58 acts liked a closed switch, coupling intermediate signal output terminal 36 to first power input terminal 32. Transistor 72 turns "full" on, since the voltage at intermediate signal input terminal 50 is greater than the voltage at the source of transistor 72. The voltage level at the drain of transistor 72 becomes approximately the same as the voltage level at the source of transistor 72, which is zero volts. Thus, transistor 72 acts like a closed switch, coupling output terminal 56 to fourth power supply terminal 54. The 1.1 volts low level of the small swing input signal has now been converted zero volts to generate the low level of the full swing output signal on output terminal 56.

Transistor 68 is now turned completely off, since the voltage at its gate is the same as the voltage at its source. Thus, transistor 68 acts like an open switch, conducting no current between its drain and source. However, transistor 64 is turned "full" on, due to the large voltage differential of 5 volts ($V_{cc}$-0 volts) between its source and its gate. Therefore, the voltage which appears at the source of transistor 64, 5 volts, now appears at the drain of transistor 64. Thus, transistor 64 acts like a closed switch, coupling first power supply terminal 38 to first power input terminal 32. Transistor 58 is still "full" on due to the 1.1 volts (the first state or low level of the small swing single) at its gate, and therefore the voltage at first power input terminal 32, which is now 5 volts, appears at intermediate signal output terminal 36 and intermediate signal input terminal 50. Transistor 70 is shut completely off, since the voltage at its source is the same as the voltage at its gate. Thus, transistor 70 acts like a closed switch. In this way, no static power dissipation occurs in transistor 70, since it is shut completely off. Nor does any power dissipation occur in transistors 60, 66 or 68 because transistor 60, as described outwardly, is shut completely off. For the same reason, no static power is dissipated in transistors 58, 62 or 64.

When the small swing signal transitions to a high level, or 3.9 volts, transistor 58 begins to shut off, since the voltage between its source and its gate is now approximately its turn on voltage or 1.1 volts. Transistor 60 turns "full" on since the voltage between its gate and its source (2.8 volts) is greater than its turn on voltage (1.1 volts). Therefore, the voltage at second power input terminal 34, which is 1.1 volts, appears at intermediate signal output terminal 36 and intermediate signal input terminal 50. Thus, transistor 60 acts like a closed switch, coupling intermediate signal output terminal 36 to second power input terminal 34. Transistor 72 is still on slightly since the voltage between its gate and source is its turn on voltage, and transistor 70 turns "full" on, due to the fact that the voltage between its source and gate (3.9 volts) is much greater than its turn on voltage. Therefore, voltage $V_{cc}$, or 5 volts, appears at output terminal 56. Thus, transistor 70 acts like a closed switch, coupling third power supply terminal 52 to output terminal 56. The 3.9 volt high level of the small swing signal is now converted to the 5 volt high level or first state of the full swing signal output voltage on output terminal 56.

Next transistor 64 shuts completely off, because the voltage at its source is the same as the voltage (5 volts) at its gate. Thus, transistor 64 acts like an open switch, conducting no current between its drain and its source. As a result, the voltage at first power input terminal 32 drops down to 3.9 volts. This shuts transistor 58 completely off, because now the voltage at its source is the same as the voltage at its gate. Thus, transistor 58 acts like an open switch, conducting no current between its drain and its source.

Transistor 68, however, is now turned "full" on, resulting in the voltage at second control signal terminal 46 and first power input terminal 32 equalling Vg or zero volts. Thus, transistor 68 acts like a closed switch, coupling first power input terminal 32 to second power supply terminal 44. Transistor 60 is still "full" on, so zero volts now appears at intermediate signal output terminal 36 and intermediate signal input terminal 50. Transistor 72 shuts completely off because the voltage at its gate is the same as the voltage (zero volts) at its source. Thus, transistor 72 acts like an open switch, conducting no current between its drain and its source. Again, this results in little or no static power dissipation in the signal receiver circuit 20.

Figure 3:
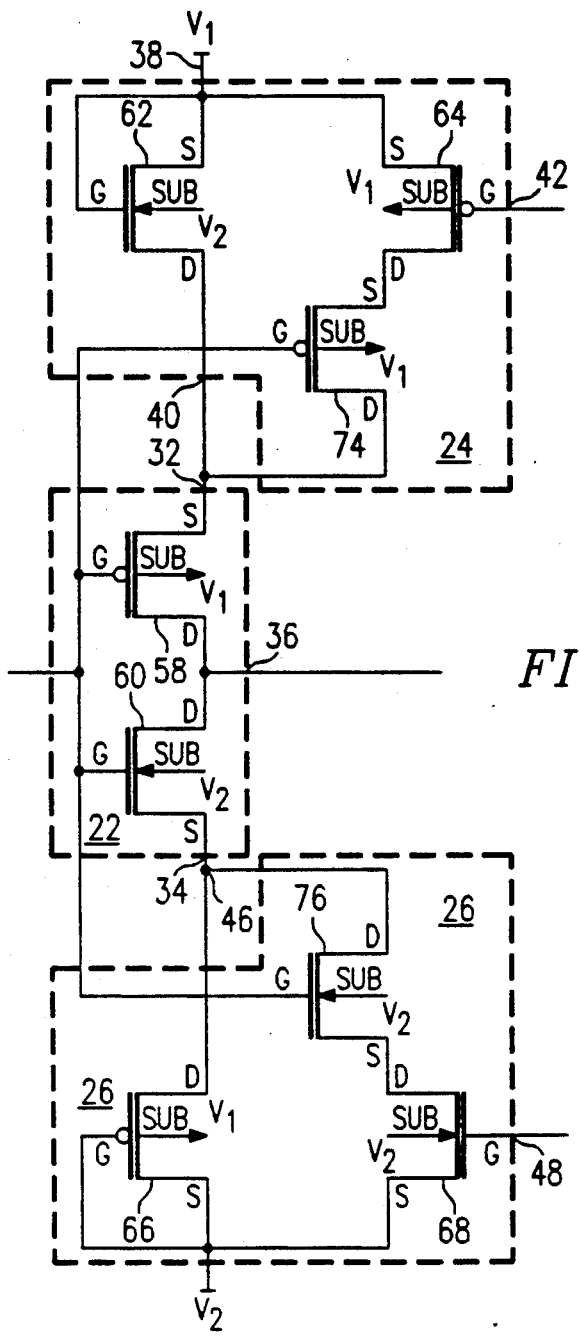
FIG. 3 is an alternative embodiment of the signal receiver of FIG. 2.

FIG. 3 is an alternate embodiment of the signal receiver of FIG. 2. First feedback stage 24 and second feedback stage 26 are shown, each having an additional transistor 74 and 76 respectively. P-channel transistor 74 has its source coupled to the drain of transistor 64, its drain coupled to first control signal terminal 40, and its gate coupled to small swing signal input terminal 30. The substrate of transistor 74 is coupled to first power supply terminal 38, but for clarity, is shown coupled to voltage $V_1$ in FIG. 3. The drain of transistor 64 is no longer coupled to first control signal terminal 40.

Transistor 76 has its source coupled to the drain of transistor 68, its drain coupled to second control signal terminal 46, and its gate coupled to small signal input terminal 30. The substrate of transistor 76 is coupled to second power supply terminal 44, but for clarity, is shown coupled to voltage $V_2$ in FIG. 3. The drain of transistor 68 is no longer coupled to the second control signal terminal 46.

In operation, transistor 74 acts as a closed switch when the small swing signal transitions to a low level. That is, transistor 74 couples the drain of transistor 64 to the first control signal terminal 40. When the small swing signal transitions to a high level, the voltage at first power input terminal 32 falls back to 3.9 volts. This follows from the fact that the voltage between the source and the gate of transistor 74 is just at the threshold level of 1.1 volts, and therefore, the voltage at the drain of transistor 64, which is 5 volts, does not appear at the first control signal terminal 40. In other words, transistor 74 acts like an open switch. In this way, the transistor 64 shuts off more quickly than it does in the embodiment of FIG. 2, because the first feedback stage 24 does not need to wait for the full swing output signal to transition to a high level before transistor 64 can shut off completely.

In a like manner, transistor 76 acts as a closed switch when the small swing signal is at a high level. That is, transistor 76 couples the drain of transistor 68 to the second control signal terminal 46. When the small signal transitions to a low level, the voltage at second control signal terminal 46 rises to 1.1 volts, and therefore, the voltage at the drain of transistor 68, which is zero volts, does not appear at the second control signal terminal 46. In other words, transistor 76 acts like an open switch. In this way, transistor 66 shuts off more quickly than it does in the embodiment of FIG. 2, because second feedback stage 26 does not need to wait for the full swing output signal to transition to a low level before transistor 66 shuts off completely.

Referring again to FIG. 1, a signal driver 78 converts a full swing signal to a small swing signal. Signal driver 78 provides a full swing signal input terminal 80, a small swing signal output terminal 82, a fifth power supply terminal 84 coupled to a voltage $V_5$, and a sixth power supply terminal 86 coupled to a voltage $V_6$.

Figure 4:
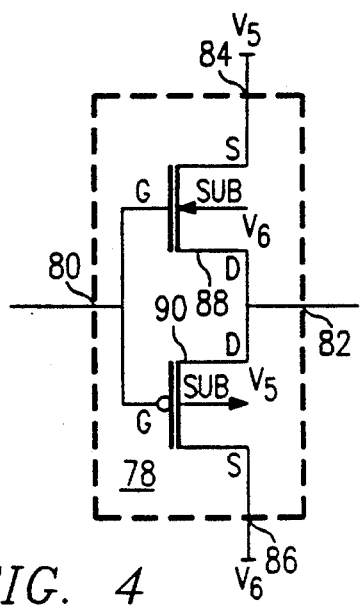
FIG. 4 is a circuit diagram of the signal driver of FIG. 1.

FIG. 4 is a circuit diagram of signal driver 78. Signal driver 78 comprises an N-channel MOS transistor 88, whose source is coupled to fifth power supply terminal 84 and whose drain is coupled to small swing signal output terminal 82. The substrate of transistor 88 is coupled to sixth power supply terminal 86, but for clarity, is shown coupled to voltage $V_6$ in FIG. 5. Signal driver 78 also provides a P-channel MOS transistor 90 having its drain coupled to small swing signal output terminal 82 and having its source coupled to sixth power supply terminal 86. The substrate of transistor 90 is coupled to fifth power supply terminal 84, but for clarity, is shown coupled to voltage $V_5$ in FIG. 5. The gates of both transistors 88 and 90 are coupled to the full swing signal input terminal 80.

In operation, a full swing signal is applied to full swing signal input terminal 80. When the full swing signal transitions to a high level, or 5 volts, transistor 90 shuts completely off and conducts no current from its drain to its source. This transition also causes transistor 88 to conduct a slight amount of current from its source to its drain. A reduced voltage level appears at small swing signal output terminal 82, due to the turn-on voltage of 1.1 volts required between the gate and the drain of transistor 88. The voltage at small swing signal output terminal 82 is therefore 3.9 volts. When the full swing signal is low or zero volts, then transistor 88 shuts off and transistor 90 turns on. Due to the turn-on voltage required between the drain and the gate of transistor 90, the voltage at small swing signal output terminal 82 is 1.1 volts. In this way, the full swing signal, which transitions from a low value or second state of zero volts to a high value or first state of 5 volts, is reduced to a small swing signal at small swing input signal output terminal 82 providing a low value of 1.1 volts, and a high value of 3.9 volts.

The combined signal driver/signal receiver circuit 92 of FIG. 1 comprises the signal driver 78 and the signal receiver 20. Small swing signal output terminal 82 and small swing signal input terminal 30 are coupled by a signal channel 94. In the embodiment of FIG. 1, signal channel 94 is a high capacitance line within an integrated circuit.

In operation, the signal driver 78 functions as described inwardly to convert the full swing signal applied to full swing signal input terminal 80 into the small swing signal output on small swing signal output terminal 82. Driving the signal channel 94 with a small swing signal requires less power than would be needed to drive signal channel 94 with the full swing signal. The small swing signal propagates along signal channel 94 to small swing signal input terminal 30.

Signal receiver 20 functions as described inwardly to convert the small swing signal into the full swing signal output on full swing signal output terminal 80.

Although the present invention and its advantages have been described in detail, it should be understood that various changes, substitutions and alterations can be made therein without departing from the spirit and scope of the invention as defined by the appended claims.

What is claimed is:

1. A signal receiver circuit for converting a small swing signal into a full swing signal comprising:

an input stage, having a first power input terminal, a second power input terminal, a small swing signal input terminal and an intermediate output terminal, said input stage producing an intermediate signal at said intermediate output terminal;

an output stage having an intermediate signal input terminal for receiving said intermediate signal, and an output terminal, said output stage producing the full swing signal on said output terminal;

a first feedback stage, having a first power supply terminal for receiving a voltage at a first level, a first feedback terminal and a first control signal terminal for receiving the full swing signal and for providing a first control signal to said first power input terminal; and a second feedback stage, having a second power supply for receiving a voltage at a second level different from said first level, a second feedback terminal, and a second control signal terminal coupled to said second power input terminal, said second feedback stage providing a second control signal to said second power input terminal.

2. The signal receiver circuit of claim 1, wherein said first feedback stage comprises:

a first switch for coupling said first power supply terminal to said first power input terminal when the full swing signal is in a first state, such that said first control signal is generated, and wherein said second feedback stage comprises:

a second switch for coupling said second power supply terminal to said second power input terminal when the full swing signal is in a second state, such that said second control signal is generated.

3. The signal receiver circuit of claim 2 wherein said first switch comprises a first transistor and said second switch comprises a second transistor.

4. The signal receiver circuit of claim 2 wherein said first feedback stage further comprises:

a third switch for providing said first control signal from said first switch to said input stage when the small swing signal is in said first state, and wherein said second feedback stage further comprises:

a fourth switch for coupling said second control signal from said second switch to said input stage when the small swing signal is in said second state.

5. The signal receiver circuit of claim 1 wherein said input stage comprises:

a first switch for generating said intermediate signal by coupling said first control signal to said output stage when the small swing signal is in a first state; and a second switch for generating said intermediate signal by coupling said second control signal to said output stage when the small swing signal is in a second state.

6. The signal receiver circuit of claim 1 wherein said output stage comprises:

a first switch for coupling a first voltage to said output terminal when the small swing signal is in a first state; and a second switch for coupling a second voltage to said output terminal when the small swing signal is in a second state.

7. A signal receiver circuit for converting a small swing signal into a full swing signal comprising:

an input stage for receiving the small swing signal and for generating an intermediate signal;

an output stage for receiving said intermediate signal and for generating the full swing signal;

a first feedback stage for receiving the full swing signal and for providing a first control signal to said input stage, said first feedback stage comprises a first switch for coupling a first voltage to said input stage when the full swing signal is in a first state, such that said first control signal is generated;

a second feedback stage for receiving the full swing signal and for providing a second control signal to said input stage, wherein said second feedback stage comprises a second switch for coupling a second voltage to said input stage when the full swing signal is in a second state, such that said second control signal is generated;

wherein said first switch comprises a first substrate coupled to said first voltage and said second switch comprises a second substrate coupled to said second voltage.

8. A signal receiver circuit for converting a small swing signal into a full swing signal comprising:

an input stage for receiving the small swing signal and for generating an intermediate signal;

an output stage for receiving said intermediate signal and for generating the full swing signal;

a first feedback stage for receiving the full swing signal and for providing a first control signal to said input stage, said first feedback stage comprises a first switch for coupling a first voltage to said input stage when the full swing signal is in a first state, such that said first control signal is generated;

a second feedback stage for receiving the full swing signal and for providing a second control signal to said input stage, wherein said second feedback stage comprises a second switch for coupling a second voltage to said input stage when the full swing signal is in a second state, such that said second control signal is generated;

wherein said first feedback stage further comprises a first diode coupled across said first switch for generating said first control signal when the full swing signal is in said second state; and wherein said second feedback stage further comprises a second diode coupled across said second switch for generating said second control signal when the full swing signal is in said first state.

9. The signal for converting a full swing signal, having a high level and a low level, into a small swing signal having a reduced high level and an increased low level, the signal driver comprising:

a first transistor, responsive to the high level, for generating the reduced high level, said first transistor being coupled to a first voltage higher than said reduced high level; and a second transistor, responsive to the low level, for qenerating the increased low level, said second transistor being coupled to a second voltage lower than said increased low level, wherein said first transistor comprises a first substrate coupled to said second voltage, and wherein said second transistor comprises a second substrate coupled to said first voltage.

10. A conversion circuit for converting a full swing signal having a high level and a low level into a small swing signal having a reduced high level and an increased low level and for reconverting the small swing signal into the full swing signal, the conversion circuit comprising:

a first transistor, responsive to the high, level for generating the reduced high level;

a second transistor, responsive to the low level, for generating the increased low level;

an input stage for receiving the small swing signal and for generating an intermediate signal;

an output stage for receiving said intermediate signal and for generating the full swing signal;

a first feedback stage for receiving the full swing signal and for providing a first control signal to said input stage; and a second feedback stage for receiving the full swing signal and for providing a second control signal to said input stage.

11. The conversion circuit of claim 10 wherein said first feedback stage comprises a first switch for coupling a first voltage to said input stage when the full swing signal is at the low level, such that said first control signal is generated, and wherein said second feedback stage comprises a second switch for coupling a second voltage to said input stage when the full swing signal is at the high level, such that said second control signal is generated.

12. The conversion circuit of claim 11, wherein said first feedback stage further comprises a first diode coupled across said first switch for generating said first control signal when the full swing signal is at the high level, and wherein said second feedback stage further comprises a second diode coupled across said second switch for generating said second control signal when the full swing signal is at the low level.

13. The conversion circuit of claim 11 wherein said first feedback stage further comprises a third switch for providing said first control signal from said first switch to said input stage when the small swing signal is at the increased low level and wherein said second feedback stage further comprises a fourth switch for coupling said second control signal from said second switch to said input stage when the small swing signal is at the reduced high level.

14. The signal receiver circuit of claim 10 wherein said input stage comprises:

a first switch for generating said intermediate signal by coupling said first control signal to said output stage when the small swing signal is at the increased low level; and a second switch for generating said intermediate signal by coupling said second control signal to said output stage when the small swing signal is at the reduced high level.

15. A method for converting a small swing signal into a full swing signal comprising the steps of:

generating an intermediate signal in response to the small swing signal, a first control signal and a second control signal;

generating the full swing signal in response to said intermediate signal;

providing said first control signal in response to the full swing signal;

providing said second control signal in response to the full swing signal;

wherein the step of generating the full swing signal comprises the steps of:

coupling a first voltage when the small swing signal is in a first state such that the full swing signal is substantially the same as said first voltage; and coupling a second voltage when the small swing signal is in a second state such that the full swing signal is substantially the same as said second voltage.

16. A method for converting a small swing signal into a full swing signal comprising the steps of:

generating an intermediate signal in response to the small swing signal, a first control signal and a second control signal;

generating the full swing signal in response to said intermediate signal;

providing said first control signal at a first voltage when said full swing signal is in a first state; and providing said second control signal at a second voltage different from said first voltage in response to said full swing signal being at a second state.

* * * * *